United States Patent [19]
Silver

[11] Patent Number: 5,166,902
[45] Date of Patent: Nov. 24, 1992

[54] SRAM MEMORY CELL

[75] Inventor: John Silver, Colorado Springs, Colo.

[73] Assignee: United Technologies Corporation, Hartford, Conn.

[21] Appl. No.: 670,557

[22] Filed: Mar. 18, 1991

[51] Int. Cl.⁵ .............................................. G11C 13/00
[52] U.S. Cl. .................................... 365/182; 365/154; 365/189.01; 365/189.05
[58] Field of Search ........... 365/185, 154, 149, 189.01, 365/189.05, 203, 230.01

[56] References Cited
U.S. PATENT DOCUMENTS
5,115,288 5/1992 Manley .................................. 365/165

Primary Examiner—Terrell W. Fears

[57] ABSTRACT

A compact SRAM memory cell employs two invertor areas longitudinally offset along a longitudinal axis and having transistor gates interdigitated, with a gate electrode of one invertor extending perpendicular to the longitudinal axis to make contact with the output node of the other invertor. Adjacent cells are related by a 180° rotation through a transverse edge and a reflection through a longitudinal edge.

15 Claims, 5 Drawing Sheets fig.1 fig.2
prior art fig.3 fig.4 fig. 5 fig.6a fig.6b fig.7a fig.7b fig.8a fig.8b

SRAM MEMORY CELL

DESCRIPTION

1. Technical Field

The field of the invention is that of integrated circuit processing (using the silicon-on insulator (SOI) technique in which active elements of an integrated circuit are formed in isolated silicon mesas positioned above an insulating lower layer). A particular circuit illustrated is a static random access memory (SRAM).

2. Background Art

It is known in the art to make silicon-on insulator circuits and, in particular, SRAM circuits in which the conventional six transistor SRAM memory cell includes P-channel and N-channel transistors, with all the N-channel transistors being formed on one or more P-well mesas and the P-channel transistors being formed on N-well mesas.

The art has constantly sought a decrease in the area occupied by a memory cell and improvement in reliability provided by simplification of interconnections in a cell.

DISCLOSURE OF INVENTION

The invention relates to an SRAM memory cell originally designed for use with a silicon-on insulator technique in which both P-channel and N-channel transistors are formed in the same mesa in a storage or latch portion of a cell that is separated from one or more mesas containing the pass transistors used together with the storage portion of the memory cell.

The layout of the cell is characterized by division into two areas, a pass area containing the mesas for the pass transistors and a latch area containing the four transistors for the latch portion of the memory cell, with the pass areas of adjacent cells meeting in an interlocking relationship in which first and second pass areas of adjacent cells overlap along the longitudinal axis.

The layout of the cell is further characterized by division into two half cells disposed on opposite sides of a first longitudinal axis, each half containing a pass transistor and an inverter, one electrode of each pass transistor being connected directly to the gate node of the corresponding inverter gates and to the output node of the other inverter in the other half cell. Each half cell is further divided into a pass portion containing the pass transistor and an inverter or latch portion containing the inverter, the two pass portions being located on the same side of a transverse axis, so that they form together a cell pass portion separated from a cell latch portion containing the two inverters.

The cells are arranged in an array characterized in that pairs of cells are related by a 180° rotation about the longitudinal axis, so that the pass portions of neighboring cells are adjacent and a first pass transistor of a first half of one cell abuts a second pass transistor of a second half of the other cell and vice versa - the second pass transistor of the second half of the first cell abuts the first pass transistor of the first half of the second cell.

Other features and advantages will be apparent from the specification and claims and from the accompanying drawings which illustrate an embodiment of the invention.

BEST MODE FOR CARRYING OUT THE INVENTION

Figure 1:
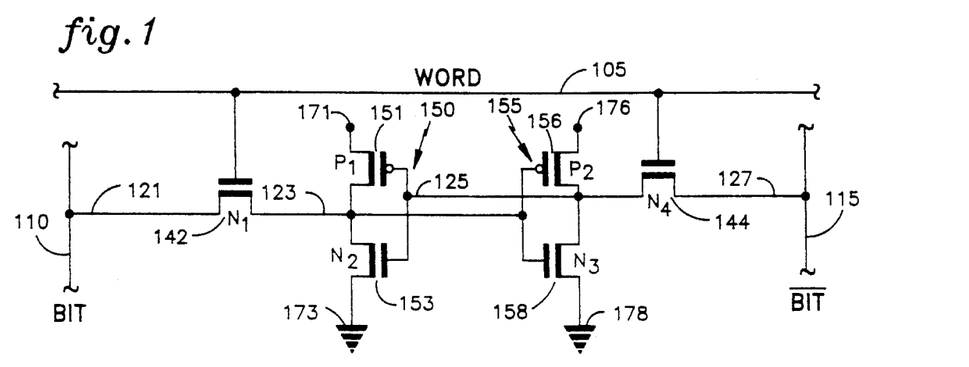
FIG. 1 illustrates a schematic of a standard six transistor SRAM cell.

Referring now to FIG. 1, there is shown a schematic diagram of a standard six transistor SRAM cell in which word-line 105 traveling horizontally in the diagram controls two pass transistors 142 and 144, illustratively N-channel transistors in this version, that connect the interior or latch portion of the memory cell to a bit-line 110 and a bit-bar line 115. The operation of the SRAM cell is well known. It comprises two cross-coupled inverters 150, comprising a P-channel transistor 151 and an N-channel transistor 153 connected between a positive voltage and ground, with an intermediate output node and a second inverter 155 comprising P-channel transistor 156 and N-channel transistor 158. The two cross-coupling nodes are node 123 connecting the "bit" pass transistor 142 with the common node of inverter 150 and the gate nodes of inverter 155. The other common node is 125 which connects the "bit-bar" transistor 144 with the common node of inverter 155 and the gate node of inverter 150. The terms bit and bitbar refer to the conventional labels for the pair of bit lines to which the pass transistors make contact.

Figure 2:
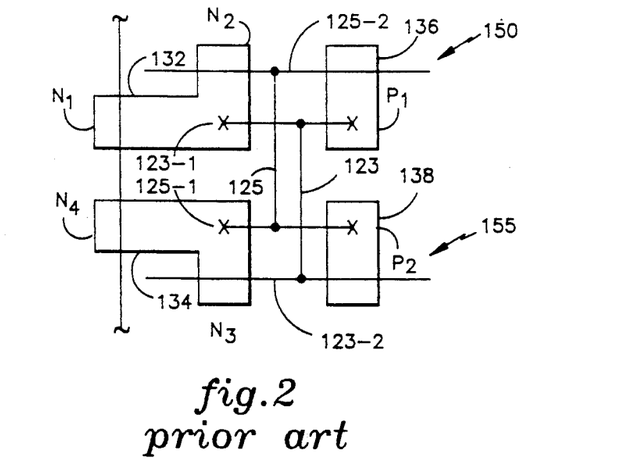
FIG. 2 illustrates a layout of a prior art SRAM cell.

A prior art layout used for prior SOI SRAM circuits is illustrated in FIG. 2, in which mesas 132 and 134, respectively, contain all the N-channel transistors, N1 and N4 being on the top edge of the diagram and N2 and N3 being at the bottom. Two P-channel mesas contain the P-channel transistors. The two cross-coupling nodes are illustrated with the same reference numerals 123 and 125. (The nodes are labelled 123 for the contact portion and 123-1 and 123-2 for the subsidiary portions. The same notation is used for node 125. This approach has been used in the past and offers the obvious merit that, since transistors of the same polarity are on a mesa, there is no problem with interference from the dopants used to form the transistors. In particular, since pass transistor N1 and the first N2 transistor share a common electric node 123, it is convenient to form that node on the same mesa. There is a disadvantage that the connections on nodes 125 and 123 must cross, so that reliability is less than it might be if such a crossover could be eliminated. In going from line 123-1, the poly gates of transistors N2 and P1, to line 123-2, the connection between the poly gates of transistors N1 and P2, the center portion of line 123 must cross line 125. This is conventionally accomplished by going up to first level metal and then back down, but crossovers are a source of defects—the fewer the better.

Figure 3:
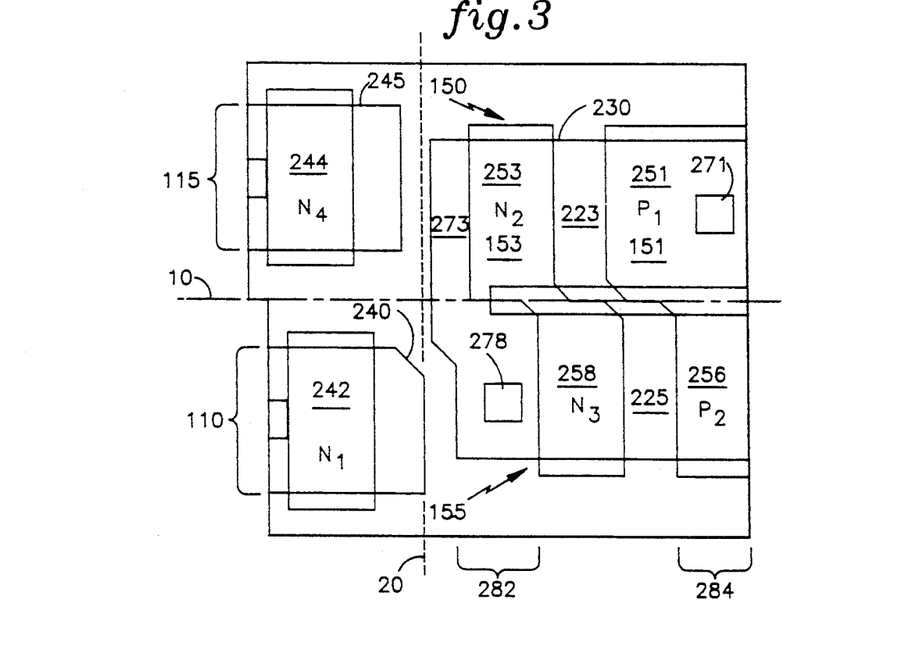
FIG. 3 illustrates lower layers of an SRAM cell constructed according to the invention.

Referring now to FIG. 3, there is illustrated the mesas and wells in an SRAM cell constructed according to the invention. Since the layout may be used with bulk silicon technology and GaAs, the terms "transistor area" and "inverter area" will be used as substitutes for "mesa" to indicate an area within which a transistor or inverter is formed. In the case of a single transistor, a "transistor area" may be the same as a well. The term "mesa" as used herein is not restricted to a layer of silicon that is entirely surrounded by insulator. The silicon areas within which inverters 150 and 155 are found will be referred to as mesas, even though area 273 connects them to form composite mesa 230. On the left, or pass, edge of the cell are two mesas 240 and 245 containing, respectively, the first pass transistor N1 on P-well 242 of mesa 240 and the second pass transistor N4 on P-well 244 of mesa 245. These pass transistors are shown on the left edge of the Figure, as in the prior art, but they are not in the same mesa as the other N-channel transistors. The mesas are displaced along longitudinal axis 10 for reasons that will be explained below. Transverse axis 20 divides the pass portion of the cell on the left from the logic or latch portion on the right.

On the right hand of FIG. 3, there is shown a single composite mesa 230 having a generally U-shape which includes on the bottom portion of the U both of the N-channel transistors N2 and N3 of the latch portion of the cell in P-wells 253 and 258. On the right of the Figure or on the legs of the U are formed the two P-channel transistors P1 and P2 in N-wells 251 and 256. On the upper portion of the Figure or the left leg of the U of mesa 230 is formed inverter 150 comprising transistors P1 and N2. The area 223 forming common node 123 between transistors P1 and N2 will be discussed below. Similarly, on the bottom portion of the Figure, there is formed inverter 155 comprising transistor P2 and transistor N3 with the area 225 between them. Areas 223 and 225 correspond to portions of nodes 123 and 125 of FIG. 1. On the left portion of mesa 230 there are shown areas denoted by the numerals 273 and 278 corresponding to ground connections 173 and 178 in FIG. 1. On the upper right edge of mesa 230 is shown contact 271 corresponding to the +5 V contact 171 of FIG. 1.

Figure 4:
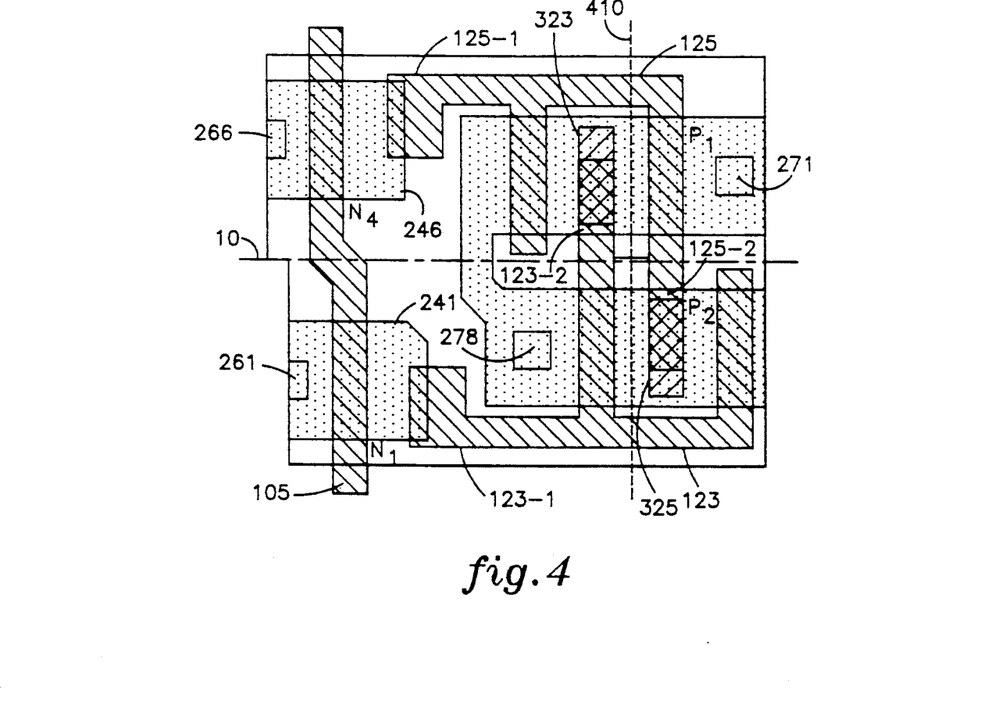
FIG. 4 illustrates higher layers of an SRAM cell constructed according to the invention.

FIG. 4 illustrates another view of the cell, showing the first-level polysilicon straps that form the gates of the transistors and other interconnections. The dotted regions are the "active" portion of the silicon mesas, which are slightly smaller than the mesas. Those skilled in the art are aware that some processes employ a blanket implant that is appropriate for one polarity and a set of smaller area implants forming wells of the other polarity. The well interface in that case is the boundary between the background area and the smaller wells. The term well interface will be used to mean a boundary between areas of opposite polarity, whether the boundary is included within a transistor (source or drain) or whether there is a tolerance variation between the transistor and the boundary of the well. Dotted line 410 in FIG. 4 marks the boundary between the P+ implant for the sources and drains of the P-channel transistors and the N+ implant for the sources and drains of the N-channel transistors. The P-N junctions formed along line 410 are shorted out by silicide straps as described below.

As can be seen, the physical realization of node 125 is an "F" having a first section running from pass transistor N4 parallel to axis 10 and two transverse extensions that are the gates of transistors P1 and N2. The extension that forms the gate of P1 continues on to contact output node 225 of the other inverter in section 125-2. Similarly, node 123 runs from pass transistor N1 along the bottom edge of the cell, having transverse extensions interdigitated ( meaning sequentially alternating extensions from the two nodes that overlap along the transverse axis) with the extensions of node 123.

Referring now to the electrical characteristics of mesa 230, it will be evident to those skilled in the art that node 223 between transistors P1 and N2 will have a P-N junction between the drain of P1 and the source of N2. A silicide strap 323 is deposited over gate 123-2 and the top of the mesa in this area to short out the source and drain, thus preventing the formation of a diode at the junction. Similarly, there will be a P-N junction in area 225 of the lower portion of mesa 230 which is also shorted out by a silicide strap 325. The interface between source and drain will be referred for convenience as a "well interface". In the process used for this circuit, the edges of the source and drain are the same as the edges of a well. An additional advantage of the invention is that this suppression of diode action is effected without any loss of area because the P-N junction is also shorted out by the connections 123-2 and 125-2 that are needed to complete the cross coupling between inverters 150 and 155. On the left of mesa 230 the ground connection in area 273 has a silicide covering also which improves the conductance of that area. The silicide straps are put down after the first layer of polysilicon is formed, in a conventional (preferably self-aligned) siliciding process. It will be evident to those skilled in the art that the short circuit over the P-N junction could also be obtained by the use of a polysilicon layer or a layer of metal. The boundary where the P-well abuts the N-well will be referred to as a well interface.

The brackets on the left of FIG. 3, labeled 110 and 115, illustrate the portions where bit-lines 110 and 115 cross over the memory cell. They will be formed in second level metal in the illustrative embodiment. On the bottom of FIG. 3, additional brackets labeled 282 and 284 illustrate the portion where the bus lines for 0 volts and +5 volts, respectively, travel vertically in this drawing.

Figure 5:
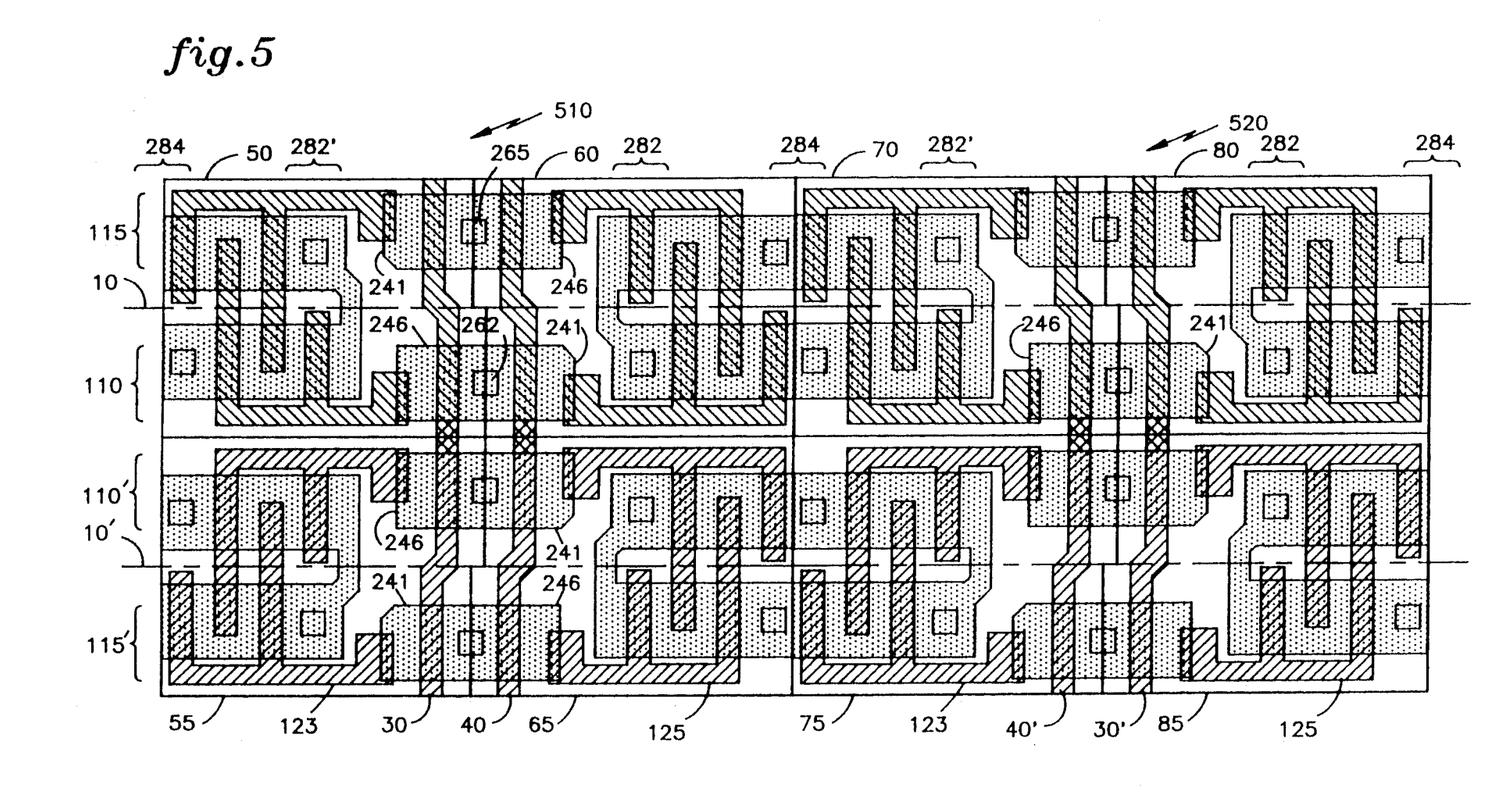
FIG. 5 illustrates a macro cell comprising four of the individual memory cells.

Referring now to FIG. 5, there is shown a pair of macro cells 510 and 520, each formed from a composite of four of the inventive cells. In order to present an uncluttered drawing, only the poly gates, contacts and mesas are shown, with the mesas being represented by the active sub-areas within the mesas. The four sub-cells of macro cell 510 are denoted by the numerals 50, 55, 60 and 65, respectively. Macro cell 520 comprises cells 70, 75, 80 and 85. Cell 60 has been described with respect to FIGS. 3 and 4. Cell 50 is related to cell 60 by a 180° rotation about an axis perpendicular to the plane of the circuit. Cell 55 is the mirror image of cell 50 reflected through the common cell edge. Similarly, cell 65 is the mirror image of cell 60. A pair of longitudinal cell axes, 10 and 10', travels horizontally in this figure. The designation of horizontal and vertical is used only for convenience in reading the drawing, since the orientation of the axes on a chip is arbitrary. The bit lines travel parallel to axes 10, denoted by brackets carrying the numerals 110, 115 and 110', 115'. They will be connected to conventional sense amplifiers to read out the value within an individual memory cell. Within macro cell 510, contact is made to bit line 110 by vias above contact 262 that overlaps active areas 246-50 and 241-60 in cells 50 and 60, using the notation of labelling counterpart features with the number of the cell. Bitbar line 115 is connected to contact 265 that overlaps active areas 246-70 and 241-80 in cells 50 and 60, It should be noted that the relationship is not complete symmetry in the shape of the features, though of course there is electrical symmetry.

Cells 50 and 60 are related by a rotation of 180° about longitudinal axis 10, as are cells 60 and 70 and 70 and 80. Therefore, the physical elements alternate on consecutive rows of the array. Thus, at the boundary of cells 50 and 60, a contact 262 is formed from half-contact 266 of cell 50 and half-contact 261 of cell 60. Contact 265 is formed from half-contact 266 of cell 60 and half-contact 261 of cell 50. This is a consequence of the fact that mesas 240 and 245 abut or are adjacent at the boundary of cells 50 and 60.

Cells 50 and 55, 60 and 65, etc., are mirror images, reflected through the longitudinal cell boundary. An advantage of this combination of reflection and rotation may be explained with reference to the contacts. In addition to sharing bit lines, the +5 V contacts are also shared between cells. Contact 271, the counterpart to contact 171 in FIG. 1, is placed on composite mesa 230 at the edge of transistor P1, but a counterpart to contact 176 does not exist in this cell. Instead, as can be seen by inspection of the interface between cells 60 and 70 of FIG. 5, the source of transistor P2 in cell 60 is connected to +5 V through contact 271-70 in cell 70, since the source of P2 is as close to contact 271-70 as the design rules permit. Similarly, contact 271-60 is shared with cell 70 through the conductivity of the mesa, rather than by having the contact itself overlap both cells. As can be seen in FIG. 5, the physical mesa 230 on the chip extends continuously across the cell boundary to form a single mesa having the general shape of a ring.

Further, it can be seen from FIG. 4 that each leg of the composite mesa has room for two transistors and one contact, though two contacts (+5 V and ground) are required. By interdigitating the polycrystalline silicon (poly) strips 123 and 125 that form the transistor gates and the cross-coupling connection at the output node, it is possible to place three poly strips and one contact on a smaller area than would be required for a layout such as that shown in FIG. 2.

The efficient packing of transistors on composite mesa 230 results in an asymmetry, with the lower leg having a transistor at the cell boundary and the upper leg having a contact. This is reflected in the left edge of the mesa, where the lower leg is displaced to the right. In order to take advantage of this shift, mesa 240 is also displaced to the right of mesa 245, being positioned as close to the lower corner of mesa 230 as the design rules will allow. If the cells were reflected through the logic edge or the pass edge, there would be no advantage to this displacement, but the use of rotation permits a space saving to be made by it. The boundary of a cell on the pass side is thus not a straight line, but has an offset. As can be seen, the rotation means that mesa 240 of cell 50 is a continuation of mesa 245 of the neighboring cell 60 and the two pass edges of the cells interlock to fit together like a jigsaw puzzle.

Referring to FIG. 5, it can be seen that there are two types of mesas in the cell array. The first type is used for the pass transistors, having a simple, substantially rectangular outline. These pass transistor mesas lie under word lines 105 and each have a shared contact in the center (262, say) that is both node 121 of one cell and node 127 of the adjacent cell. One feature of this rotation arrangement is that the bit and bitbar nodes of adjacent cells share a common contact 262 with line 110. Contact 265 is also the bit line contact for one cell and the bitbar contact for the adjacent cell. Since the cells are electrically symmetric, this alternation makes no difference to the memory operation.

The second type of mesa forms the composite mesas 230 for two adjacent cells. This mesa is also continuous across the cell boundary with contacts being shared electrically by adjacent cells. The logic edge between the cells 60 and 70 has been drawn as a straight line, with contact 271 lying entirely in one cell. It could as well have been drawn with the same "jog" as on the pass edge. This displacement of one half of the cell with respect to the other, the longitudinal axis being the separating line, will be referred to as having a first (or bit) half of the cell longitudinally offset from the second (or bitbar) half of the cell.

Each of the inverter mesas or inverter areas in composite mesa 230 has a voltage contact at one end, with an inverter formed with abutting N- and P- wells being placed next to the voltage contact. The longitudinal offset results from the extension of a gate electrode across the longitudinal axis to contact the output node of the other inverter. The pair of inverters may be viewed together as a pair of parallel silicon mesas having four longitudinal positions. The first and fourth positions are occupied by a voltage contact on one of the mesas and a transistor gate on the other mesa. The second and third positions are occupied by a transistor gate on the first mesa and by a node contact on the second mesa, followed by the inverse of a node contact on the first mesa that is connected to a transistor gate on the second mesa.

Another way of viewing the layout is as a central ring mesa having voltage contacts at four dividing points between ring quadrants and inverters within a quadrant. The term "ring" is used generally and does not imply that the mesa is round. The components formed in the ring are laid out in an arrangement that is invariant under a 180° rotation. Three voltage buses extend vertically in the drawing over the ring. The central bus carries a first voltage (5 V) and the outer buses each carry the same other voltage (ground).

Travelling vertically in FIG. 5 are word-lines, which in this embodiment, are in polycrystalline silicon disposed above the substrate and below the first level metal and denoted by the numerals 30 and 40. The word-lines may be formed in other levels of conductors as is known to those skilled in the art, either an additional layer of polycrystalline silicon or one of a number of layers of metal lines. In the illustrative embodiment, a global word line in metal 1 travels generally parallel to word lines 30 and 40, being connected at intervals of 64 cells.

The brackets on the left and right of FIG. 5 illustrate the bit lines (on second level metal) 110 and 115, 110' and 115', and the brackets on the top and of the Figure illustrates the common +5 volt bus denoted by bracket 284 and the separate ground buses denoted by brackets 282 and 282'. It will be noted that the word-lines 30 and 40 are not straight but are displaced in order to accommodate the different size of mesas 240 and 245.

It is a surprising and advantageous feature of this inventive layout that the area has been reduced by 33 percent compared with a layout of the type shown in FIG. 2, using the same design rules. A substantial amount of the saving in space resulted from the use of a mesa having a complete inverter (both the N-and P-channel transistors) on it. The term "inverter mesa" will be used to refer to the portion of composite mesa 230 that contain inverters 150 and 155. In contrast, the prior art has placed the P and N channel transistors on separate mesas, for the reasons given above. This principle can be extended to other circuits.

Figure 6A:
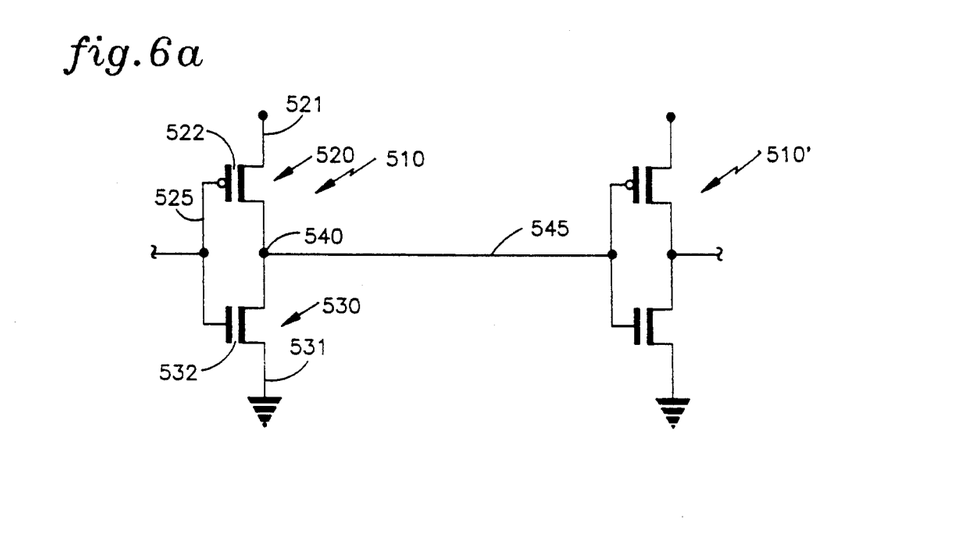
FIGS. 6a and 6b illustrate in schematic and pictorial form a pair of inverters constructed according to the invention.
Figure 6B:
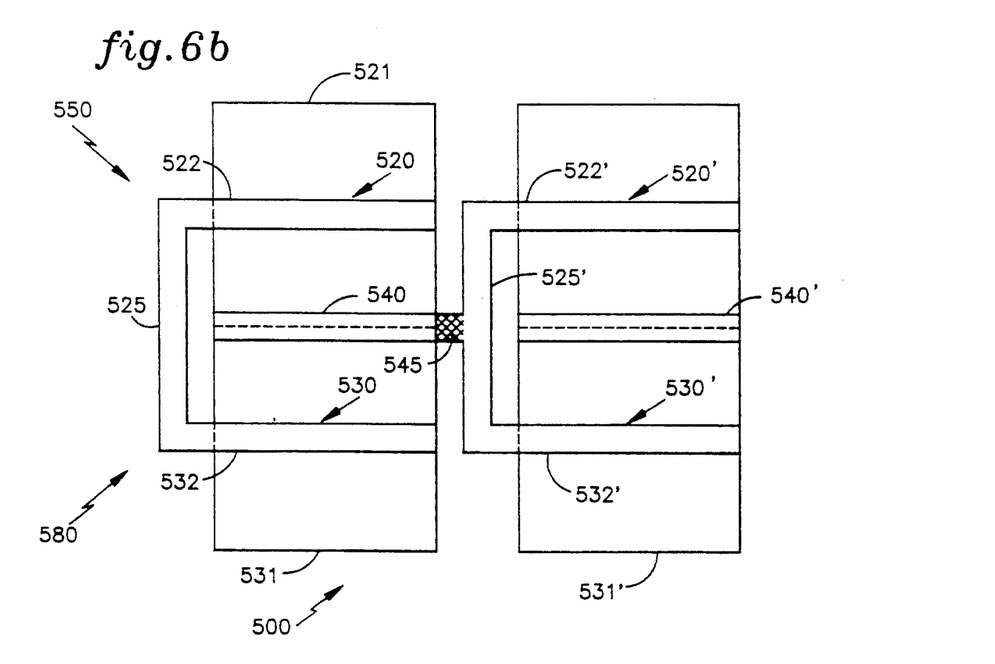

Referring now to FIG. 6, there is shown in FIG. 6a a schematic of a pair of inverters in series connection. FIG. 6b shows a top view of the layout, showing two mesas 531 and 531', each having an inverter formed on it. Mesa 531 contains an upper part 550 and a lower part 580. Part 550 contains a first P-channel transistor 520 and part 580 contains an N-channel transistor 530. The respective gates 522 and 532 are connected by connector 525. Shorting strap 540 is a silicide area formed at the intersection where the implants for the different transistors meet. On the right in the Figure, a counterpart mesa, with corresponding elements denoted by primed numerals, has connector 525' connected to output node 540 by a connection denoted by 545. Illustratively, the gates 522 and 532 and the connector 525 are formed from first level polysilicon. Connection 545, then, is the overlap between the poly of connection 525' and the silicide forming strap 540.

Figures 7A, 7B:
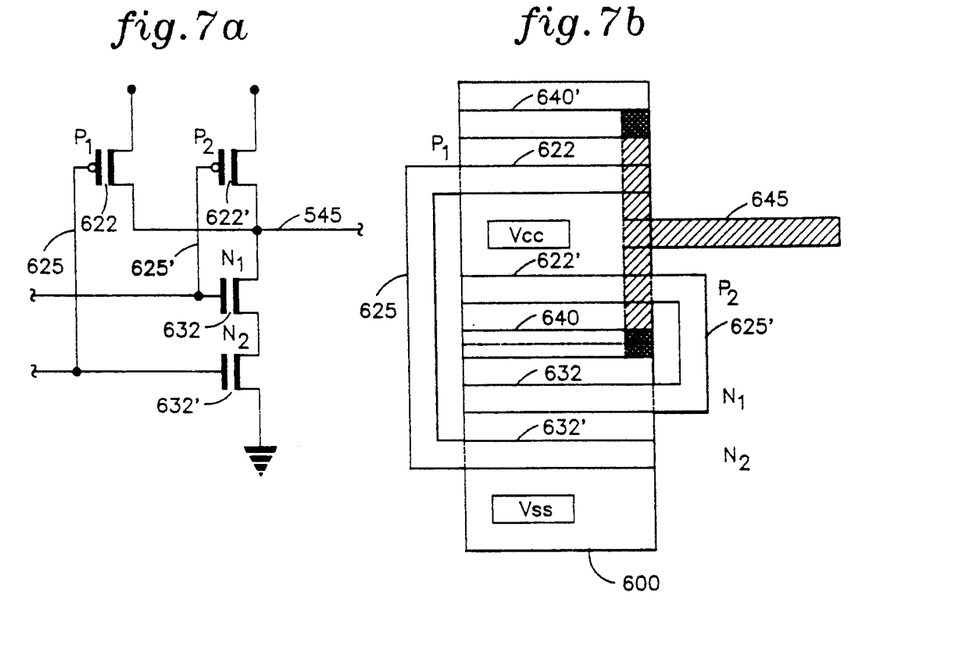
FIGS. 7a and 7b illustrate in schematic and pictorial form a NOR gate constructed according to the invention.

Another layout applying the principle of an inverter on a single mesa is shown in FIG. 7, in which FIG. 7a shows a schematic of a NAND gate formed from four transistors, P1, P2, and N1, N2. The interconnections are illustrated in FIG. 7b, in which a single mesa 600 contains all four transistors. Similar elements to the circuit of FIG. 6 have corresponding numbers. In this layout, strap 540 shorts out the differently doped areas of mesa 600 as is done in FIG. 6. Conveniently, strap 540 is part of the output node, so that no space is lost because the space that the strap occupies would be required for a contact. Strap 540' may be either poly or silicide and completes output node 545 by connecting P1 in parallel with P2.

Figure 8A:
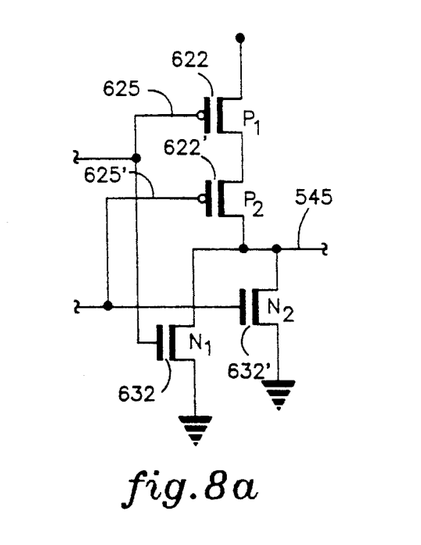
FIGS. 8a and 8b illustrate in schematic and pictorial form a NAND gate constructed according to the invention.
Figure 8B:
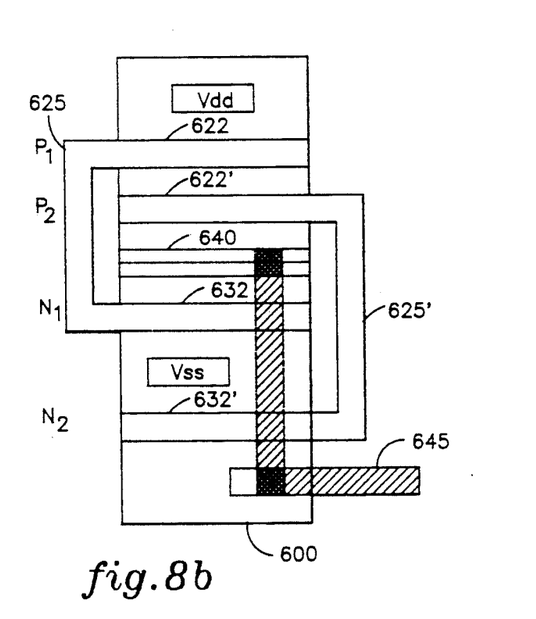

A corresponding NAND gate is illustrated in FIG. 8. The layout in this figure is chosen so that the adjacent transistors bordering strap 540 are not connected to form an inverter. The point of this layout choice is to illustrate that the invention does not depend on having the elements of an inverter separated by a silicide strap, but that the application is more general, encompassing more complex circuits than simple inverters.

It should be understood that the invention is not limited to the particular embodiments shown and described herein, but that various changes and modifications may be made without departing from the spirit and scope of this novel concept as defined by the following claims.

What is claimed is:

1. A CMOS SOI integrated circuit formed in a set of silicon mesas disposed above an insulating layer and having N-channel and P-channel transistors connected to form an electrical circuit, said N-channel and P-channel transistors being disposed on doped silicon areas in said mesas, said N-channel transistors being grouped in at least one P-well and said P-channel transistors being grouped in at least one N-well, characterized in that:

at least one of said N-wells abuts a P-well at a well interface, whereby a P-N junction is present at said well interface; and an electrically conductive strap is disposed above said P-N junction, whereby said P-N junction is short circuited by said electrically conductive strap.

2. A circuit according to claim 1, comprising an inverter, having an input node and an output node, and comprising a P-channel transistor having a P-gate and being formed in an N-well and an N-channel transistor having an N-gate and being formed in a P-well, in which circuit said P-well abuts said N-well at an inverter well interface;

in which said P-gate and said N-gate are connected at said input node; and said output node is formed at said inverter well interface.

3. A circuit according to claim 1, comprising two P-channel transistors formed in an N-well and two N-channel transistors formed in a P-well, said P-channel and N-channel transistors being disposed along a longitudinal axis, in which said P-well and said N-well have a well interface therebetween, said well interface intersecting said longitudinal axis;

both said P-channel transistors are connected in parallel between a positive voltage contact and said well interface;

both said N-channel transistors are connected in series between said well interface and a lower voltage contact;

each P-channel transistor gate is connected to a corresponding N-channel transistor gate, whereby said circuit is a NOR gate; and said well interface forms an output terminal of said NOR gate formed by said P-channel and N-channel transistors.

4. A circuit according to claim 3, in which a closest P-channel transistor adjoining said well interface has a P-channel gate connected to a corresponding N-channel gate of a closest N-channel transistor adjoining said well interface, whereby said closest P-channel transistor and said closest N-channel transistor form an inverter.

5. A circuit according to claim 1, comprising two P-channel transistors formed in an N-well and two N-channel transistors formed in an P-well, said P-channel and N-channel transistors being disposed along a longitudinal axis, in which said P-well and said N-well have a well interface therebetween, said well interface intersecting said longitudinal axis;

both said P-channel transistors are connected in series between a positive voltage contact and said well interface;

both said N-channel transistors are connected in parallel between said well interface and a lower voltage contact;

each P-channel transistor gate is connected to a corresponding N-channel transistor gate, whereby said circuit is a NAND gate; and said well interface forms an output terminal of said NAND gate formed by said P-channel and N-channel transistors.

6. A circuit according to claim 5, in which a closest P-channel transistor adjoining said well interface has a P-channel gate connected to a corresponding N-channel gate of a closest N-channel transistor adjoining said well interface, whereby said closest P-channel transistor and said closest N-channel transistor form an inverter.

7. An SRAM memory cell comprising two pass transistors and four logic transistors connected in two cross-coupled inverters, each having a gate node connecting a P- gate and an N-gate and an output node, formed by CMOS technology in a silicon layer above a silicon substrate, in which said memory cell has a pass portion containing said pass transistors on a pass side of said cell and a logic portion containing said logic transistors in a logic portion of said cell disposed on a side of said cell opposite to said pass portion, said memory cell having a longitudinal axis extending through said pass portion and said logic portion from a pass edge to a logic edge; in which
  a first group of transistors on a first side of said longitudinal axis comprises a first one of said pass transistors and a first one of said two cross-coupled inverters;
  a second group of transistors on a second side of said longitudinal axis comprises a second one of said pass transistors and a second one of said two cross-coupled inverters;
  said two cross-coupled inverters each comprise an N-channel transistor formed in an P-well and a P-channel transistor formed in an N-well, said N-well and said P-well being formed in the same inverter area of said silicon layer disposed on said substrate and having a common P-N interface containing a P-N semiconductor junction; and
  each of said P-well and N-well of said two cross-coupled inverters is electrically connected across said P-N interface by a P-N junction strap, whereby said P-N semiconductor junction is electrically short circuited by contact with said P-N junction strap.

8. An SRAM memory cell according to claim 7, in which said first pass transistor on said first side of said longitudinal axis is connected to said gate node of said first inverter in said first inverter area on said first side of said longitudinal axis and to said output node of said second inverter on said second side of said longitudinal axis;
  a second pass transistor on said second side of said longitudinal axis is connected to said gate node of said second inverter in said second inverter area on said second side of said longitudinal axis and to said output node of said first inverter on said first side of said longitudinal axis, said first and second inverters being longitudinally offset along said longitudinal axis such that first and second P-gates and first and second N-gates of said cross-coupled inverters are at different locations along said longitudinal axis; and
  a first node strap connecting said first pass transistor to said P- gate and said N- gate of said first inverter extends substantially perpendicular to said longitudinal axis to contact said output node of said second inverter.

9. A memory cell according to claim 8, in which said first node strap extends from said first pass transistor substantially parallel to said longitudinal axis and has first and second transverse branches extending substantially perpendicular to said longitudinal axis to contact said gates of said P- and N-channel transistors, one of said first and second transverse branches extending over one of said P- and N- gates to contact said output node of said second inverter.

10. A set of memory cells arranged in a rectangular array along a longitudinal axis and a coplanar transverse axis, each of said memory cells having a pass edge and a logic edge on opposite sides thereof, said pass and logic edges being substantially perpendicular to said longitudinal axis, and having first and second longitudinal edges substantially parallel to said longitudinal axis at first and second longitudinal sides, in which:
  said cells are grouped in modules of four cells in which modules, each cell is related to an adjacent cell along said longitudinal axis by a rotation of 180° about a perpendicular axis perpendicular to a plane formed by said longitudinal axis and said coplanar transverse axis and located at an intersection of said longitudinal axis and said logic edge; and
  each cell in a module is related to an adjacent cell on one of said first and second longitudinal sides by reflection through said one of said first and second longitudinal edges thereof, whereby
  said rectangular array comprises a longitudinal array extending parallel to said longitudinal axis, each cell of which is related to an adjacent cell in said longitudinal array by a rotation of 180° about said perpendicular axis at said logic edge, so that consecutive cells in said longitudinal array have adjoining logic edges; and
  a transverse array extending parallel to said coplanar transverse axis, said transverse array being comprised of cells each of which is related to an adjacent cell along said transverse axis by reflection through a longitudinal edge thereof.

11. A set of memory cells according to claim 10, in which:
  first and second pass transistors are disposed on first and second pass mesas in contact with said pass edge, each of said first and second pass mesas having a half-contact formed at a pass edge thereof, said pass mesas and said half contacts being disposed at equal distances from said longitudinal axis, whereby a first half contact on a first pass mesa in a first cell abuts a second half contact on a second pass mesa in a second cell rotated 180° with respect to said first cell about said perpendicular axis to form a composite pass transistor contact disposed overlapping a pass edge of both said first and second cells.

12. A set of memory cells according to claim 11, in which:
  two inverters are formed in first and second inverter areas on opposite sides of said longitudinal axis, each of said two inverters comprising a P-channel transistor in an N-well and an N-channel transistor in a P-well, said N-well adjoining said P-well at an inverter interface;
  first and second P-N junctions formed at said inverter interface of each of said two inverters are short-circuited by an electrically conductive member;
  a first inverter of said two inverters has a first inverter node comprising an electrically conductive material extending from said first pass transistor substantially parallel to said longitudinal axis and having first N- and P-transverse extensions extending over said N-well and said P-well respectively to form N- and P- gates of said N- and P-channel transistors, one of said first N- and P- transverse extensions extending across said longitudinal axis to make electrical contact with said second electrically conductive member at said P-N junction formed in said second inverter;

said second inverter of said two inverters has a second inverter node comprising an electrically conductive material extending from said second pass transistor substantially parallel to said longitudinal axis and having second N- and P-transverse extensions extending over said N-well and said P-well respectively to form N- and P- gates of said N- and P-channel transistors, one of said second N- and P- transverse extensions extending across said longitudinal axis to make electrical contact with said first electrically conductive member at said first P-N junction formed in said first inverter; and said first N- and P- transverse extensions are interdigitated with said second N- and P- transverse extensions.

13. A set of memory cells according to claim 12, in which each of said inverter areas has a voltage contact formed therein, a first one of said voltage contacts being disposed in proximity to said logic edge of said cell and a second one of said voltage contacts being disposed on an opposite end of the other of said inverter areas; and each of said inverter areas extends through said logic edge into an adjacent cell, whereby each of said two inverter areas in adjoining cells are in electrical contact with a corresponding rotated inverter area of said adjacent cells.

14. A set of memory cells arranged in a rectangular array along a longitudinal axis and a coplanar transverse axis, each of said memory cells having a pass edge and a logic edge on opposite sides, said pass and logic edges being substantially perpendicular to said longitudinal axis, and having first and second longitudinal edges substantially parallel to said longitudinal axis at first and second longitudinal sides, in which:

a first set of silicon mesas are disposed in said array along said transverse axis, each mesa having a mesa axis parallel to said longitudinal axis and including two inverters, each inverter comprising a P-channel transistor in an N-well and an N-channel transistor in a P-well, said N-well and said P-wells having a common interface containing a P-N semiconductor junction that comprises an output node of said inverter;

adjacent inverters along said transverse axis are cross connected to form a latch portion of an SRAM memory cell;

a second set of mesas are disposed in said array along said transverse axis, each mesa in said second set having at least one pass transistor controlled by a wordline and connected between a bitline and said output node of one of said two cross-coupled inverters, said pass transistors in said second set of mesas being connected in pairs to said two nodes of said cross-coupled inverters;

said first and said second set of mesas are alternately disposed along said longitudinal axis on said silicon semiconductor substrate, whereby a set of SRAM memory cells are formed of adjacent ones of said first and second set of mesas.

15. A set of memory cells according to claim 14, in which said first set of mesas comprise a ring of four inverters, a first pair of two on a first side of said longitudinal axis and a second pair of two on a second side of said longitudinal axis, each of said four inverters being connected to another of said four inverters on an opposite side of said longitudinal axis to form a cross-coupled pair of inverters;

said first pair of two inverters are disposed about a voltage contact of one polarity in a first portion of said first set of mesas, said voltage contact being disposed between an inner pair of transistors of a first polarity, said inner pair of transistors being disposed between an outer pair of transistors of an opposite polarity, each of said outer pair of transistors being connected between one of said P-N-semiconductor junctions and a voltage contact of a second polarity; and said first set of mesas is disposed between two of said second sets of mesas, said second sets of mesas containing pass transistors connected to corresponding output nodes to form a set of SRAM memory cells having latch portions that share said voltage contacts of one polarity.

* * * * *

UNITED STATES PATENT AND TRADEMARK OFFICE
CERTIFICATE OF CORRECTION

PATENT NO. : 5,166,902

DATED : Nov. 24, 1992

INVENTOR(S) : John Silver

It is certified that error appears in the above-identified patent and that said Letters Patent is hereby corrected as shown below:

Column 1, line 57, "180" should be $--180^{\circ}--$.

Signed and Sealed this

Eighteenth Day of January, 1994

*Attest:*

BRUCE LEHMAN

*Attesting Officer*    Commissioner of Patents and Trademarks